United States Patent
Luan et al.

(10) Patent No.: US 8,330,189 B2
(45) Date of Patent: Dec. 11, 2012

(54) ONE-TIME PROGRAMMABLE MEMORY AND METHOD FOR MAKING THE SAME

(75) Inventors: Harry S. Luan, Saratoga, CA (US); Yue-Song He, San Jose, CA (US); Ting-Wah Wong, Cupertino, CA (US)

(73) Assignee: Kilopass Technology, Inc., Santa Clara, CA (US)

( * ) Notice: Subject to any disclaimer, the term of this patent is extended or adjusted under 35 U.S.C. 154(b) by 173 days.

(21) Appl. No.: 12/819,566

(22) Filed: Jun. 21, 2010

(65) Prior Publication Data

US 2011/0309421 A1 Dec. 22, 2011

(51) Int. Cl.
*H01L 23/535* (2006.01)
(52) U.S. Cl. ............... 257/209; 257/530; 257/E23.147
(58) Field of Classification Search .................. 257/209
See application file for complete search history.

(56) References Cited

U.S. PATENT DOCUMENTS

| | | | |
|---|---|---|---|
| 6,252,293 B1 * | 6/2001 | Seyyedy et al. | 257/530 |
| 6,667,902 B2 | 12/2003 | Peng | |
| 6,713,839 B2 * | 3/2004 | Madurawe | 257/530 |
| 6,898,116 B2 | 5/2005 | Peng | |
| 6,940,751 B2 | 9/2005 | Peng et al. | |
| 6,992,925 B2 | 1/2006 | Peng | |
| 7,110,278 B2 | 9/2006 | Keshavarzi et al. | |
| 7,126,204 B2 * | 10/2006 | Frey et al. | 257/529 |
| 7,507,607 B1 * | 3/2009 | Dark et al. | 438/131 |
| 7,638,855 B2 | 12/2009 | Lung | |
| 2004/0155315 A1 * | 8/2004 | Marr et al. | 257/530 |
| 2007/0205485 A1 * | 9/2007 | Hsu et al. | 257/530 |
| 2011/0298054 A1 * | 12/2011 | Luan | 257/369 |

* cited by examiner

*Primary Examiner* — Stephen W Smoot
(74) *Attorney, Agent, or Firm* — Perkins Coie LLP

(57) ABSTRACT

A one time programmable nonvolatile memory formed from metal-insulator-semiconductor cells. The cells are at the crosspoints of conductive gate lines and intersecting doped semiconductor lines formed in a semiconductor substrate.

12 Claims, 17 Drawing Sheets

US 8,330,189 B2

ONE-TIME PROGRAMMABLE MEMORY AND METHOD FOR MAKING THE SAME

TECHNICAL FIELD

This invention relates to a nonvolatile programmable semiconductor memory, and more particularly, to the making and operating of a one-time programmable (OTP) anti-fuse memory.

BACKGROUND

Nonvolatile memory retains stored data when power is removed and is desirable in many different applications. As system-on-chips (SoCs) become more prevalent in consumer electronics and industrial applications, embedded nonvolatile memories have become more common. Embedded memory is incorporated onto the same underlying semiconductor die and non-memory circuitry.

The embedded memory is used for various purposes, among which are chip IDs, analog trimming, yield enhancement, and code storage. It would be advantageous if the embedded memories did not require added masks and process modifications to a standard CMOS flow. "Flash" memory that uses multiple polysilicon layers is not compatible with standard CMOS flow. As a result, gate dielectric based anti-fuse memory increasingly has become the choice of SoC chip designers because it is standard CMOS process based, reliable, and secure.

Gate dielectric anti-fused based memory can be broadly categorized into two groups, depending upon its operating principle. The first type is a cross-point memory consisting of a single capacitor at each gridpoint. The second type has more than two access lines for each cell in the memory array. A typical example is a storage capacitor or transistor coupled in series with a selection device such as a transistor or diode. Examples of the first type can be found in U.S. Pat. Nos. 6,898,116, 6,992,925, 7,638,855, and 7,110,278. An example of the second type is U.S. Pat. No. 6,667,902 (and the references cited therein).

Cross-point memory arrays are advantageous due to its compact layout and simple decoding. As a result, embedded OTP memories of this type can be about eight times smaller than those of the second type. However, prior art cross-point OTP memories have drawbacks, such as significant process complexity, array leakage current, and reliability.

Furthermore, for embedded applications, it is very important to comply with logic layout design rules while introducing no extra process steps or only non-critical ones. As shown in prior art FIG. 1 (FIG. 2 of U.S. Pat. No. 7,638,855 to Lung), disclosed is a cross-point antifuse memory that requires significant changes in standard CMOS process flow and needs additional critical implant masks because the N+ bit lines and P-isolations are not self-aligned. In addition, the gate dielectric before programming and the P+/N+ diode formed after programming can have questionable quality.

U.S. Pat. Nos. 6,898,116 and 6,992,925, as illustrated in prior art FIG. 2 (FIG. 28 from the '925 patent), attempted to solve these problems using standard MOSFETs by adding buried N+ or P+ bodies. In the '925 patent, there are source and drain regions that extend under the sidewall spacers, thereby connecting to the channel region under the gates. Due to the presence of source and drain regions, however, there are two potential disadvantages with this cell. First, program disturb from inhibit voltages applied to the body can occur for un-selected cells where the gate is biased at zero voltage and body at Vpp. Due to impact ionization and other high voltage mechanisms, the floating source/drain can be charged up to a voltage well above ground. As a result, the MOSFET device can be fully inverted and a large percentage of the inhibit voltage drops across the gate dielectric. Secondly, the gate dielectric may breakdown at the overlap region between the gate and LDD. When this happens at two neighboring cells, there will be a path for leakage current during both programming and read operations.

U.S. Pat. No. 7,110,278 to Keshavarzi discloses a cross-point memory similar to that of Peng except that the source and drain of each MOSFET is disconnected from its neighbors, as shown in prior art FIG. 3 (FIG. 2 of the '278 patent). The cell is bigger as a result of the non-continuous active regions. Furthermore, program disturb from the body can remain a problem because source and drain doped regions are still present for each MOSFET transistor.

Consequently, there is a need for a cross-point anti-fuse OTP memory that offers not only a compact size but also logic CMOS compatibility, low leakage current, and improved program reliability.

DETAILED DESCRIPTION

Various embodiments of the present invention are now illustrated in following figures using terms commonly employed by those skilled in the art. It will be understood that they are not intended to limit the invention to these embodiments. The invention can be practiced without one or more of the specific details, or with other methods, components, materials, process steps, or operations are not shown or described in detail in order not to obscure aspect of the invention.

Figure 1:
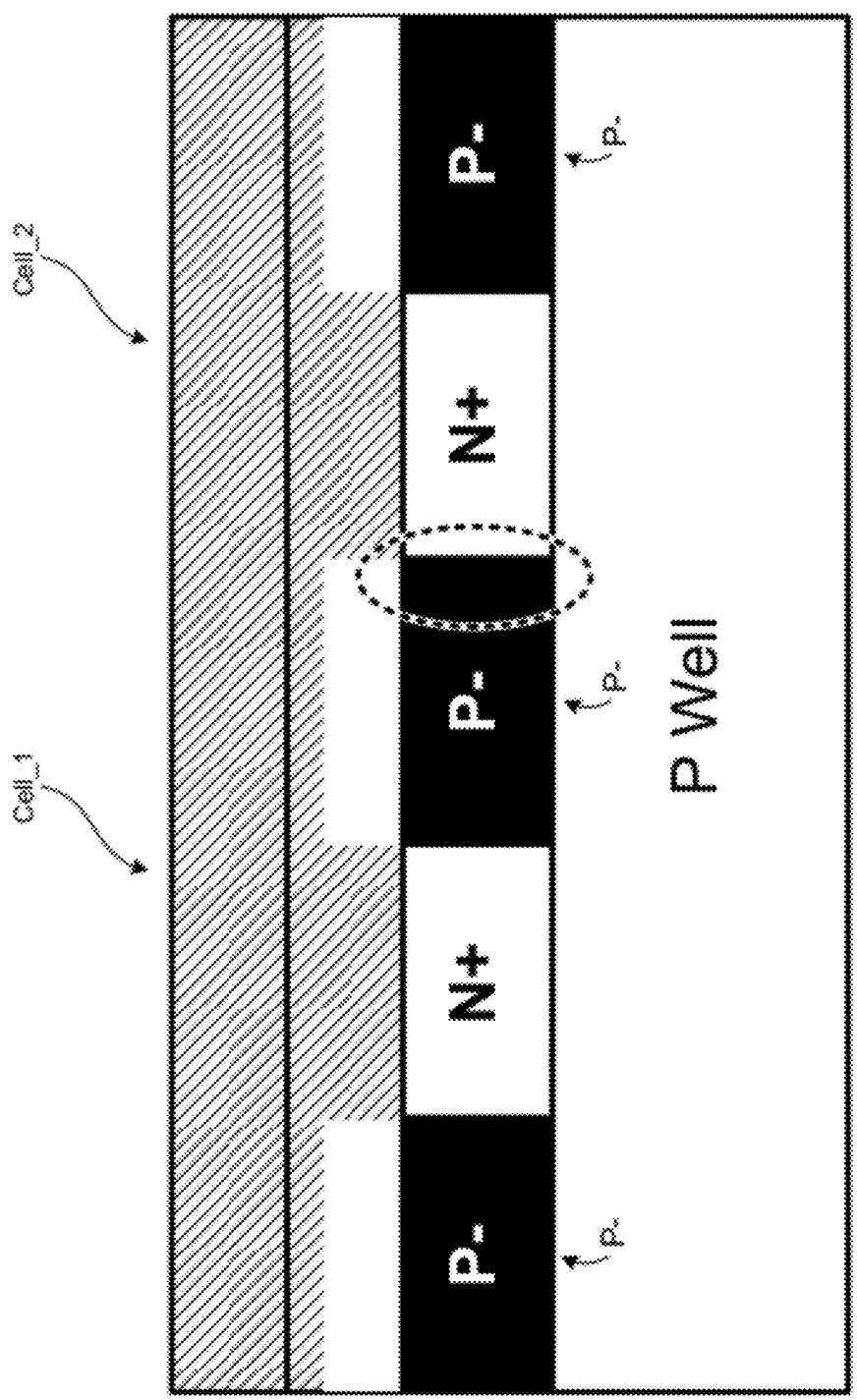
FIGS. 1-3 are prior art nonvolatile memory cells.
Figure 2:
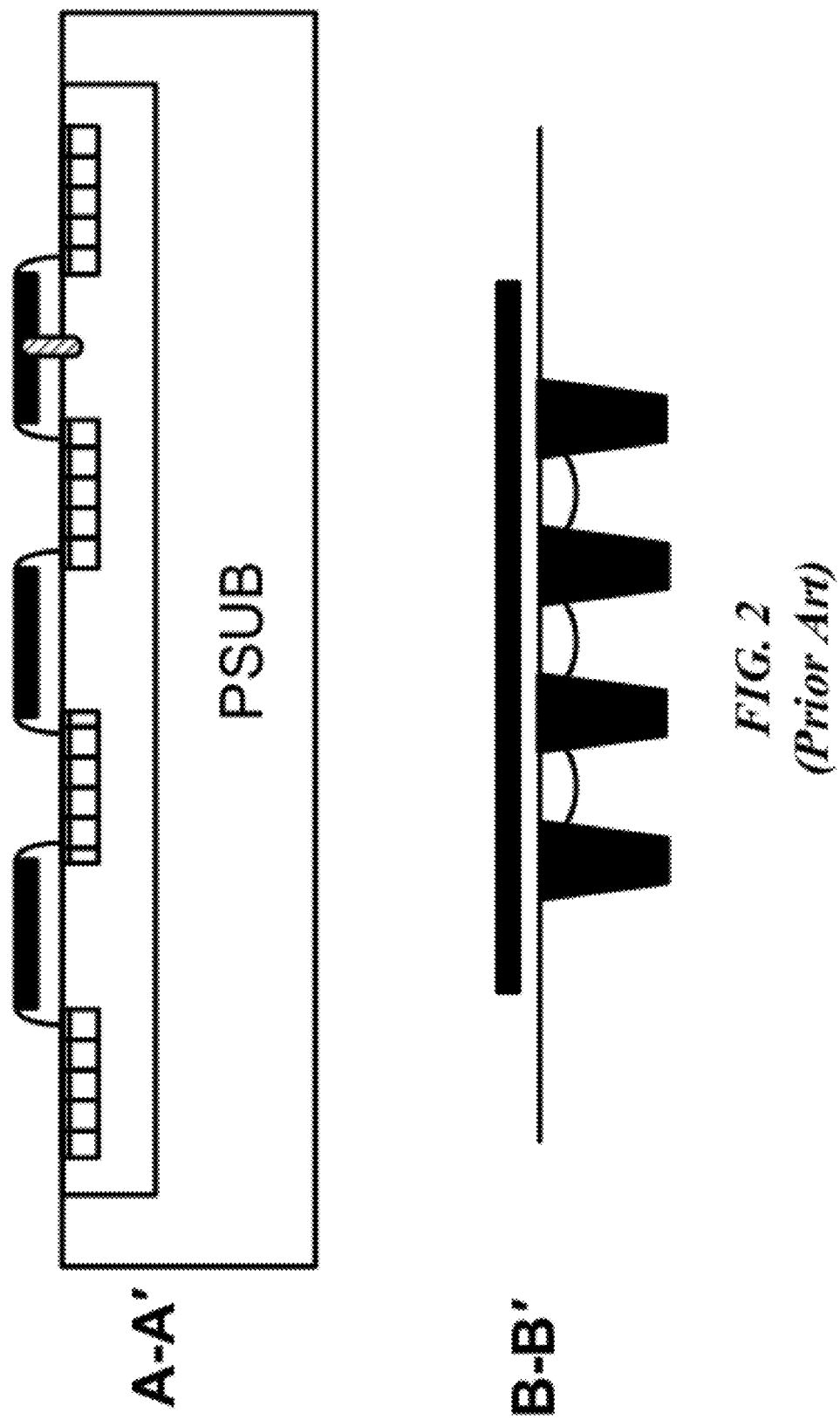
Figure 3:
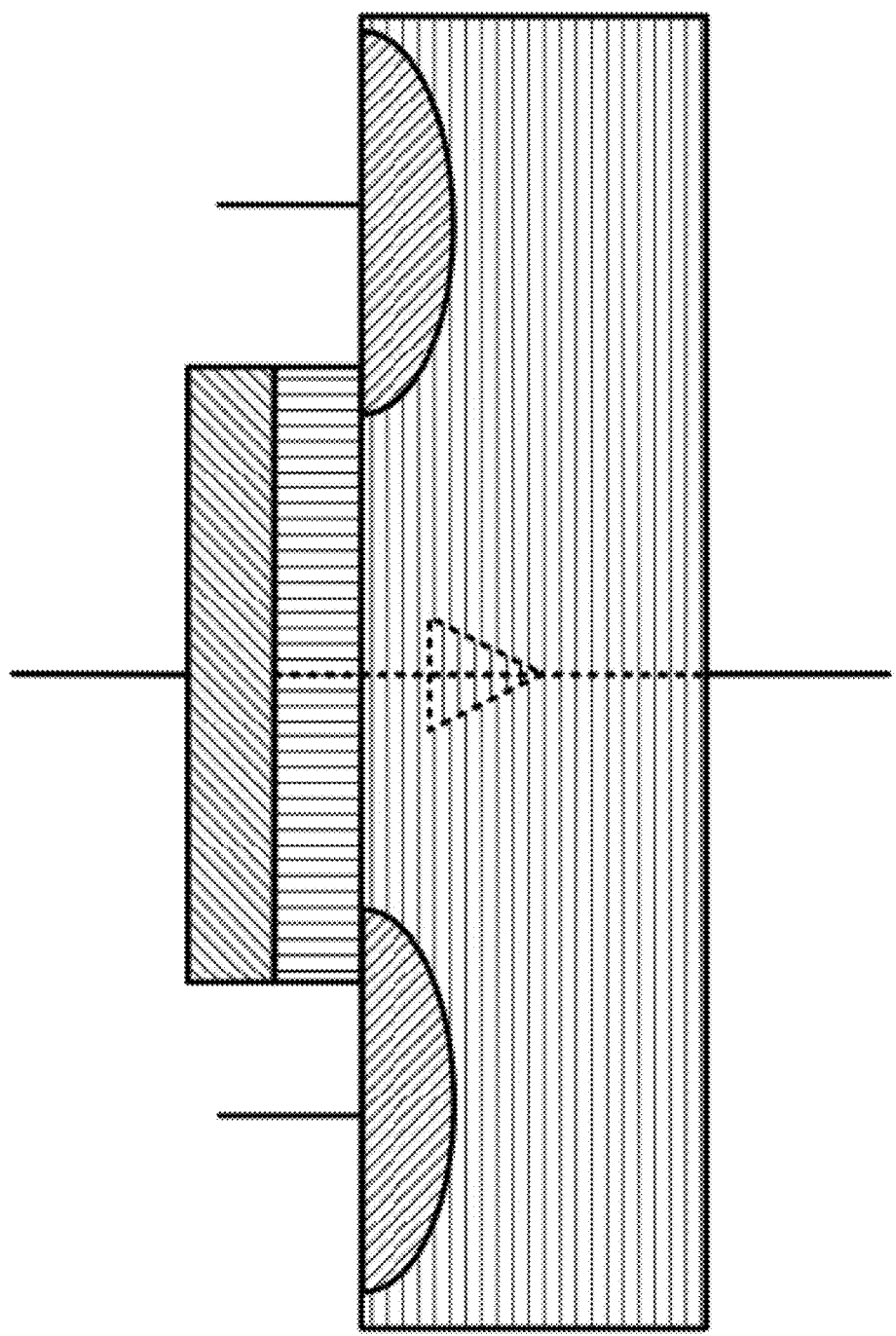
Figure 4:
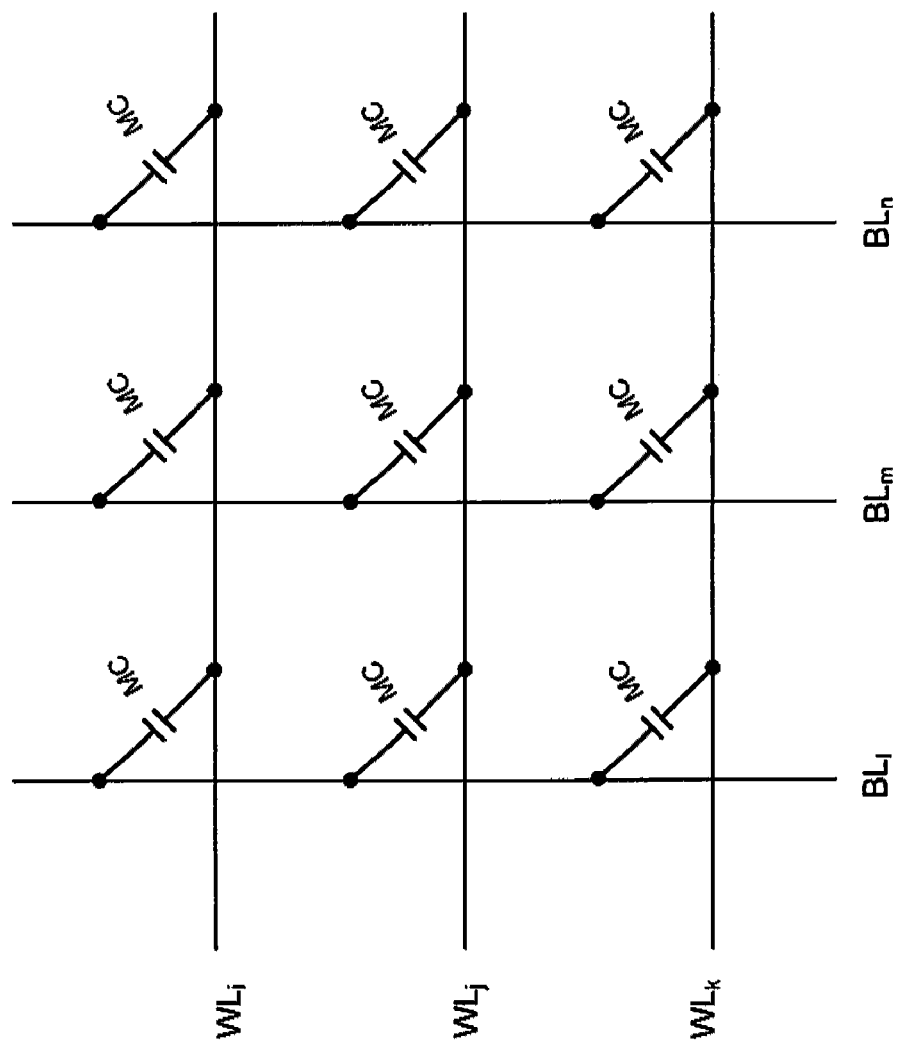
FIG. 4 shows schematically an unprogrammed memory array.

FIG. 4 illustrates a 3×3 cross-point memory array wherein each memory cell MC is shown before programming. Wordlines (WL) are positioned in the horizontal direction and bitlines (BL) in the vertical direction. Note that the orientation and terminology used to describe the lines may be switched or different terminology used altogether. A memory cell consisting of a Metal-Insulator-Semiconductor (MIS) capacitor is located at each cross point. Note that while the term "metal" is used in MIS, the metal in many embodiments is actually doped polysilicon—in the context of the present disclosure, the term metal is meant to include any and all conductive structures. The WL and BL are so named for convenience only and they are, for example, referred to as rows (R) and columns (C) interchangeably in this specification. Further, the array may be of arbitrary size m by n, where morn ranges, in one embodiment, from 1 to 1024, but may be larger.

Figure 5:
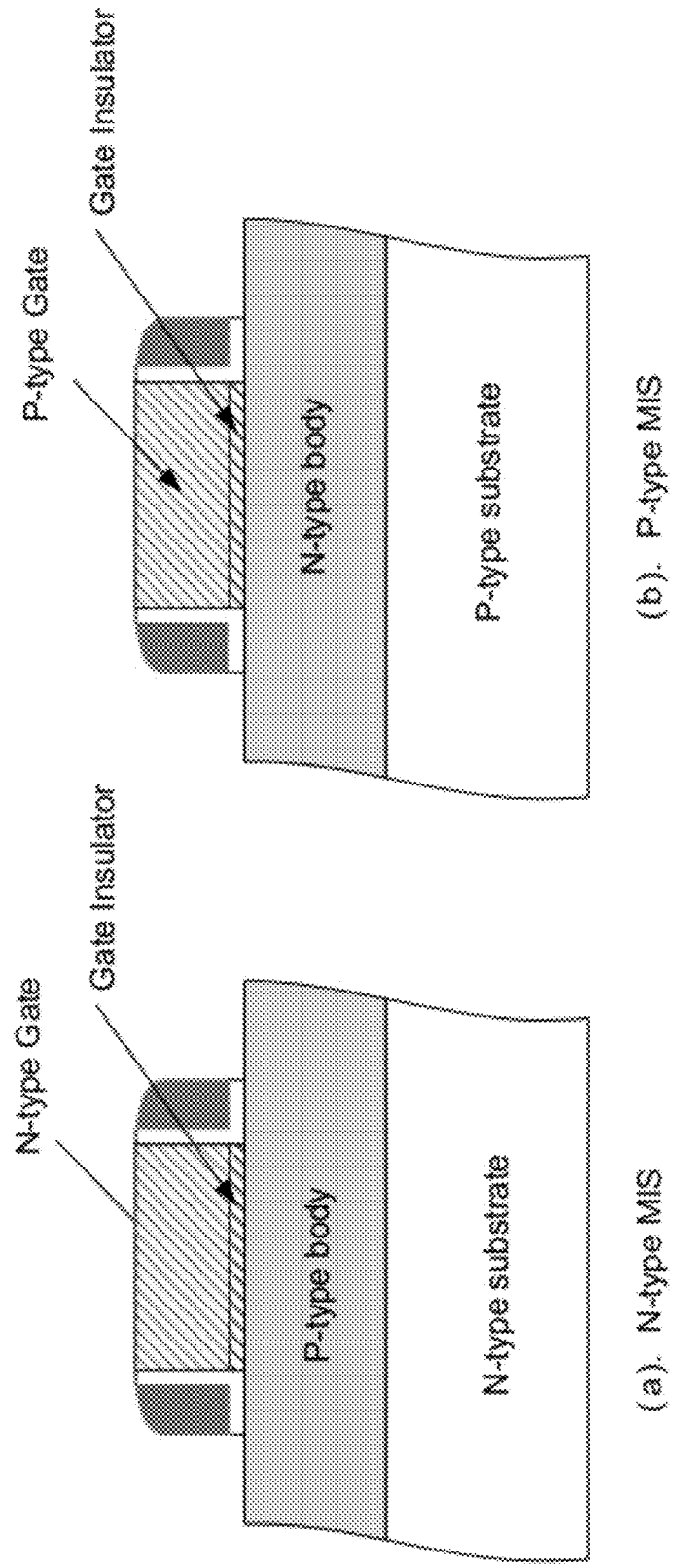
FIGS. 5a and 5b show cross sections of a memory cell of the memory array of FIG. 4.

FIG. 5 shows a cross-sectional view of two different types of the MIS memory cell. FIG. 5(a) is for an n-type MIS cell where the body is p-type and the gate is of n-type conductivity. FIG. 5(b) is for a p-type MIS cell where the doping is opposite to that of FIG. 5(a). It should be noted that the cells have a gate stack which are the same as that of a standard MOSFET. However, there are no source/drain implants (charge reservoirs) physically connected to the channel. The gate dielectric can be of any commonly used materials in the industry such as oxide, nitride, oxynitride, and other high dielectric constant materials. For convenience, p-type doped poly gate conductors will be used to describe various embodiments. In practice, n-type doped poly or metal gate can be implemented as well.

Figure 6:
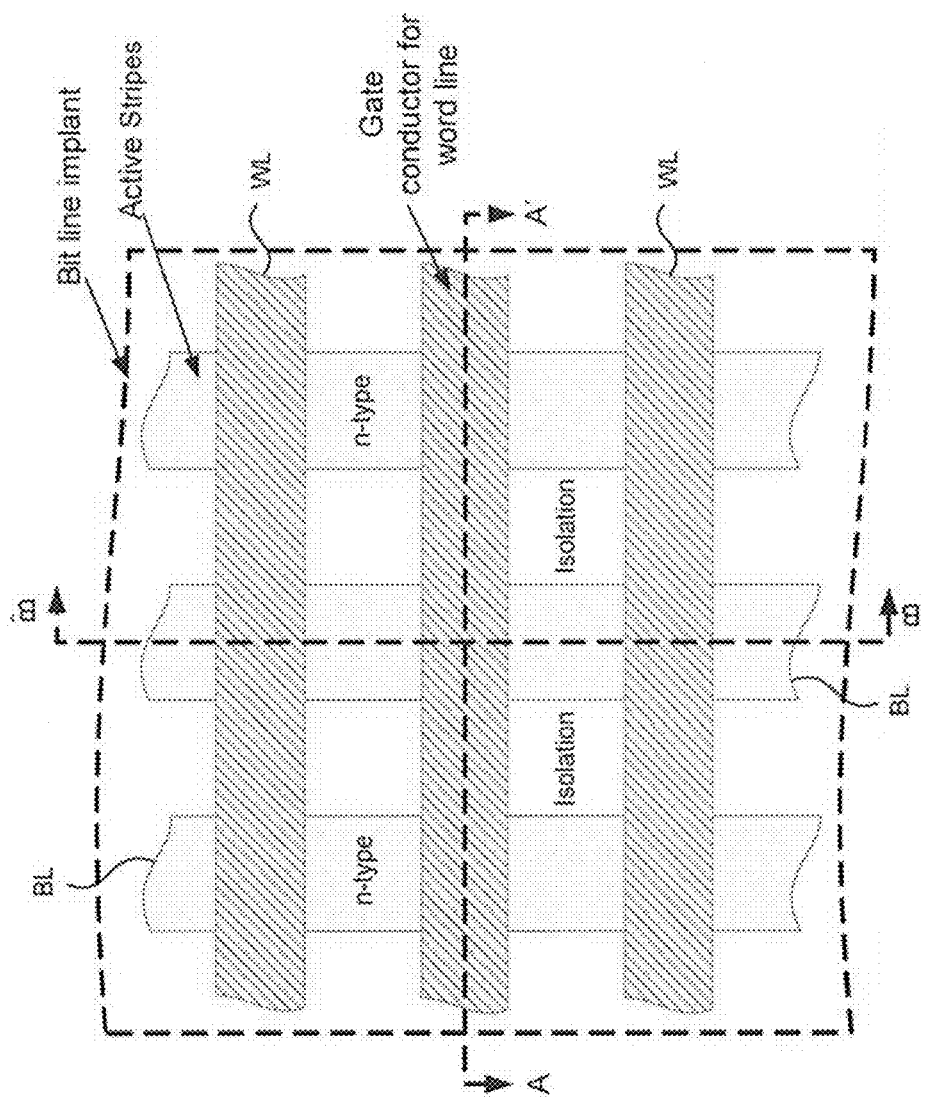
FIG. 6 shows a top plan view of a memory array.

In accordance with a disclosed embodiment, FIG. 6 shows a partial layout diagram of a 3×3 array. For simplicity, only a few relevant layers are drawn. Active stripes are formed in vertical stripes in the substrate. The active stripes are formed by a doping implant. For a p-type doped poly gate conductor, the implant would be an n-type implant into a p-type substrate. A typical doping concentration for the n-type bitlines BL could range from $1 \times 10^{18}$ to $1 \times 10^{19}$. In one embodiment, the width of the stripes range from 1× to 2× of the minimum feature size (F) that can be patterned at a given technology node. Formed between the active stripes are isolation regions, which may be, as an example, modified LOCOS or shallow trench isolation (STI). The width of the isolation regions between active stripes may also range between 1× to 2× of the minimum feature size F.

Still referring to FIG. 6, arranged in horizontal stripes are gate conductor wordlines WL. Like the bitlines BL, the WL width and spacing therebetween ranges from 1× to 2× of the minimum feature of a given process technology. Thus, for high density applications, the cell size can be as low as $4F^2$, assuming that the width of the BL, WL, and isolation spacings are all at the minimum feature size.

Figure 7:
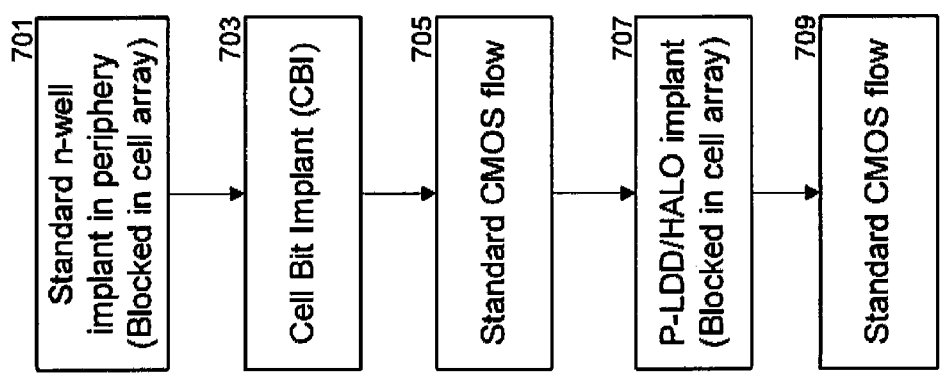
FIGS. 7 is a flow diagram of the process steps for manufacturing the memory array.

As noted, the embodiments disclosed herein follow standard CMOS process flow except for the addition of a bitline BL implant mask that is used to form the bitlines (active stripes) in the substrate. FIG. 7 shows a process flow that may be used to manufacture the disclosed embodiments. First at box 701, a standard n-well implant is performed generally in those areas outside of the memory array. Those of skill in the art recognize that n-wells are conventionally formed in a p-type substrate in a CMOS process.

While the standard n-wells are being implanted, the memory array regions are masked off in addition to the n-MOSFET devices. Thus, the drawn layer CBI serves two purposes: (1) to generate the n-well mask such that the memory array is covered while n-wells are being implanted in other areas of the substrate, and (2) to generate a bitline mask to form the active stripes. In some embodiments, this process may be performed by the combination of the n-well and bitline implants.

Next at box 703, the active stripes are implanted by the n-type dopant. This could be done with phosphorus and/or arsenic with a dose ranging from $1 \times 10^{14}$ to $1 \times 10^{15}$ and an energy ranging from 20 KeV to 80 KeV. As will be seen below, the active stripes in one embodiment have a super retrograde profile such that there is a deeper n+ band near the bottom and a shallower n− region near the surface. Depending on the particular process technology, well known multiple dose and energy implants can be used just like those used to form the standard n-well. The active stripe implant (also referred to as a cell bit implant (CBI)) may be done either before or after the regular n-well implant, without extra thermal annealing. In this embodiment, the implant is n-type dopant, similar to the n-well implant, but with a lower energy.

Figure 8:
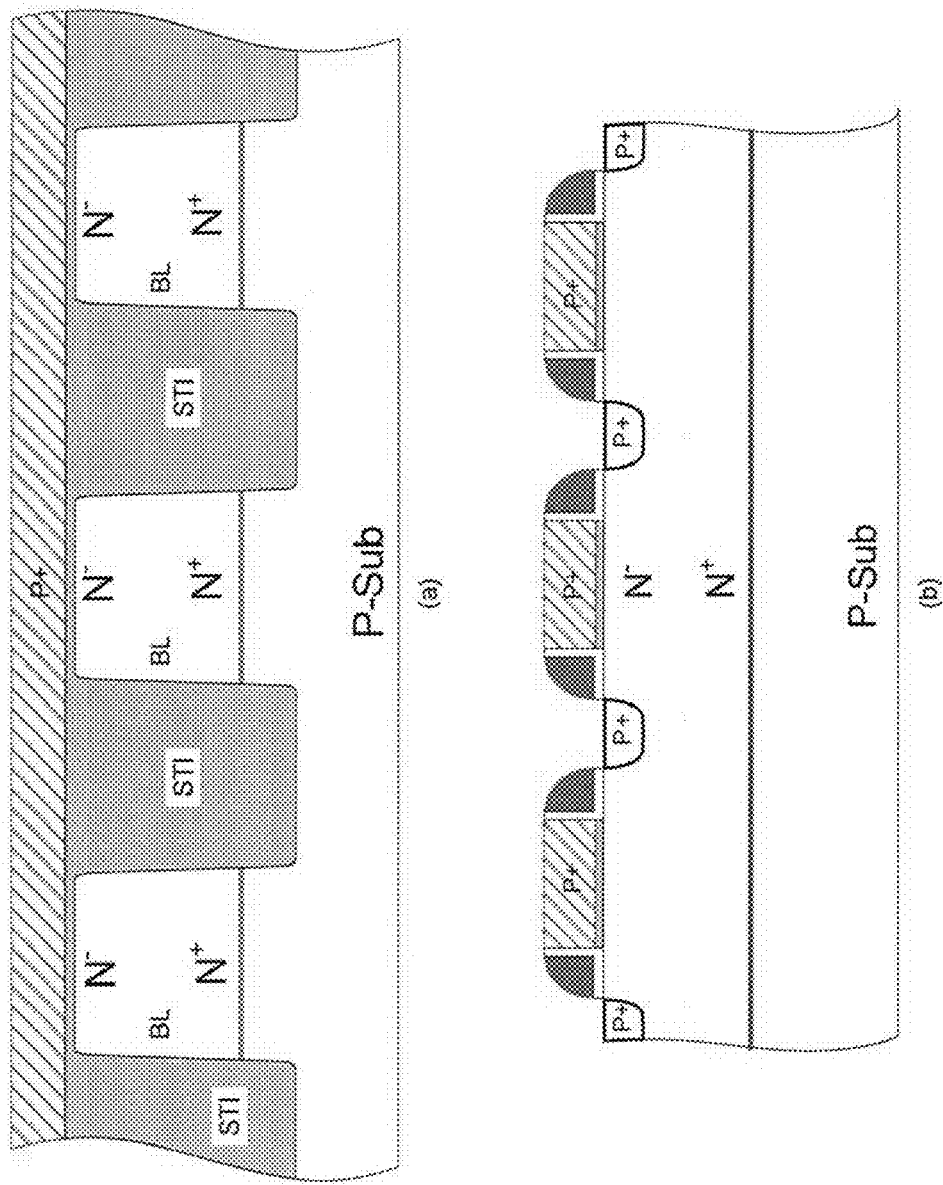
FIGS. 8a and 8b show cross-sectional views of the memory array of FIG. 6 taken along lines A-A' and B-B'.

It is desirable to have the CBI: (1) have its n-p substrate junction shallower than the isolation STI (see FIG. 8), and (2) have a super retrograde profile so that the BL resistance is low. For example, a reasonable value is about 500 Ohm to 3 KOhm between two BL strap contacts. Those skilled in the art know that the standard process modules such as the shallow trench isolation (STI), p-well implant, well annealing, and other processes are skipped for clarity and referred as the standard CMOS flow.

FIG. 8(a) is a cross-sectional view of FIG. 6 taken along A-A'. Due to the use of lower energy implants, BLs consists of heavily doped n+ regions near BL/p-Sub junction and lightly doped n− regions near the gate dielectric interface. The bitlines BL are separated by STI isolations (though other isolation structures may be used) so that there is no leakage between BLs.

FIG. 8(b) is a cross-sectional view of FIG. 6 taken along the line B-B'. Note that the cross section is different from standard PMOSFETs due to the removal of LDD/HALO implants, as shown in box 707 of FIG. 7. P+ doped regions formed in the substrate can be as a result of the standard p+ source/drain implant self-aligned to the sidewall spacers. Note that they are electrically floating and not physically connected to the channel regions. Unlike the prior art, the p+ regions do not extend to the gate, and thus are not in electrical contact with a channel region under the gate. The sidewall spacers on the gates separate the p+ regions from the channel.

Indeed, as noted above, the p+ floating regions are not part of the active cell devices and therefore are optional (and can be masked out). However, to avoid additional masking steps, they can be left in (since they are floating and electrically isolated) and are formed from self-aligned source/drain implant when standard CMOS poly gate design rules are used.

Figure 9:
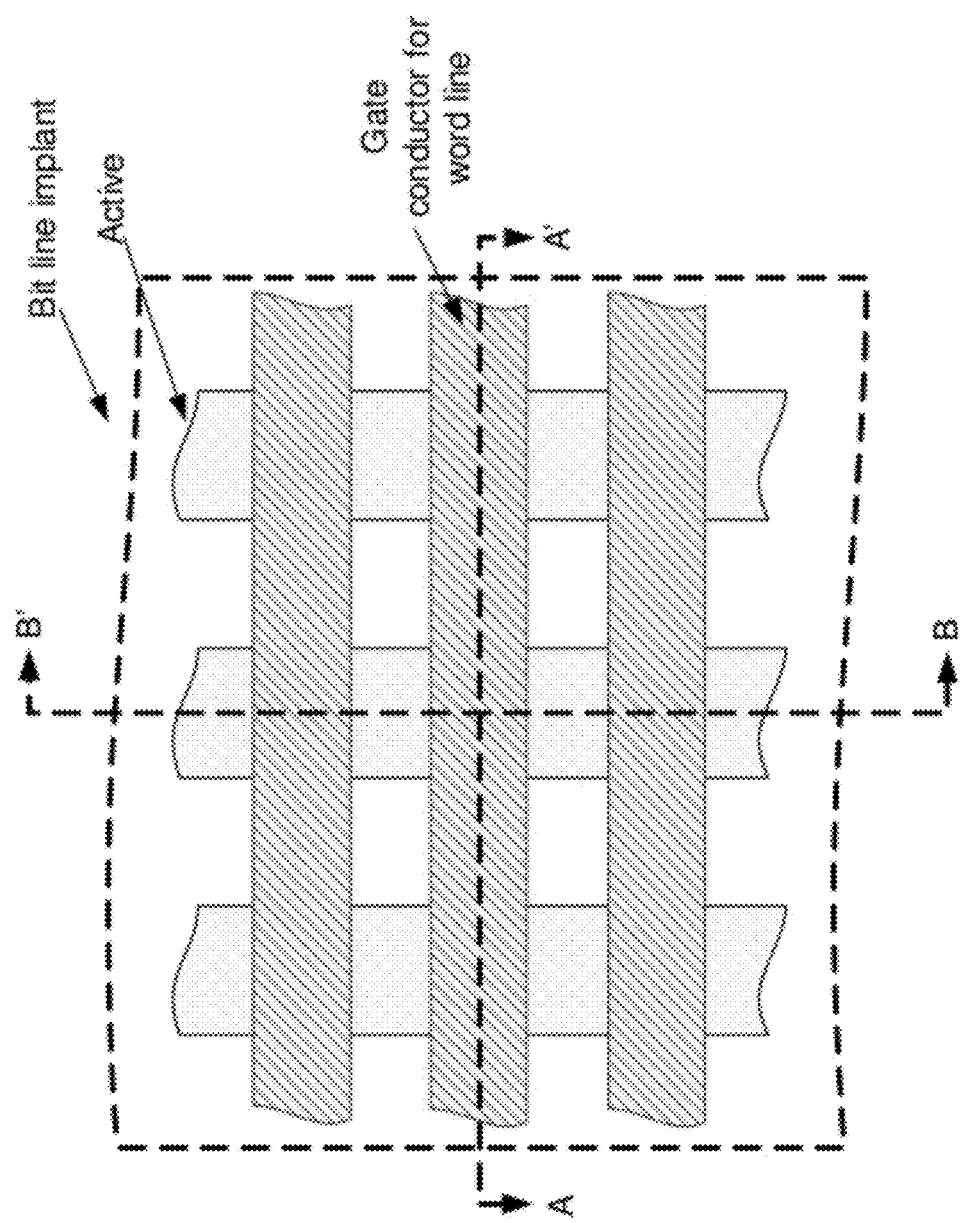
FIG. 9 shows a second embodiment of a memory array.
Figure 10:
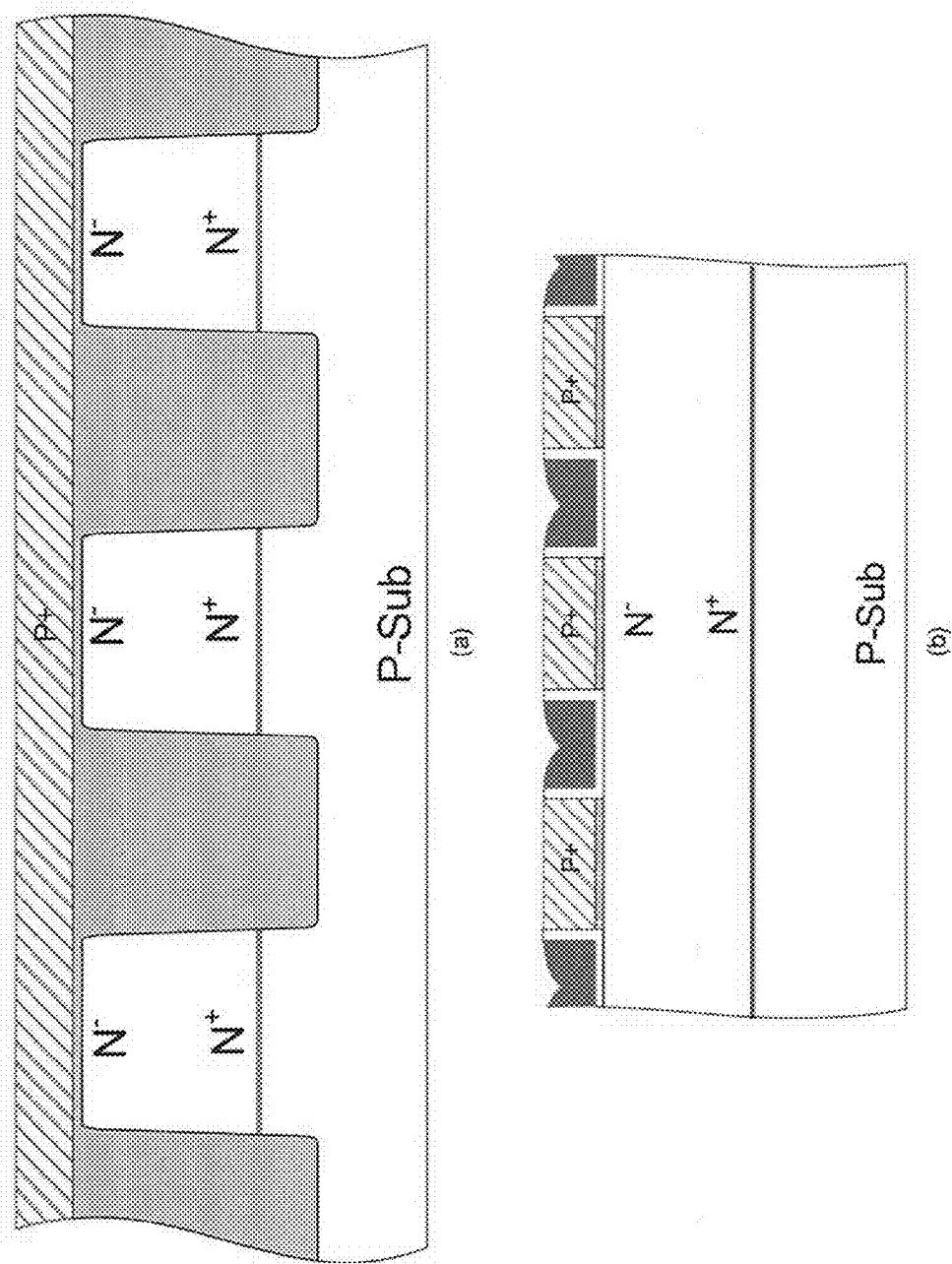
FIGS. 10a and 10b show cross-sectional views of the memory array of FIG. 9 taken along lines A-A' and B-B'.

One way to eliminate the optional p+ floating regions is illustrated in FIGS. 9 and 10, which show another embodiment of the memory array. Here the gate spacing is so designed such that when standard sidewall spacer deposition is performed, the sidewall spacers conformally fills the space between adjacent wordlines WL. As a result, as seen in FIG. 10(b), the space between adjacent gates are substantially filled after spacer etch. This prevents the p+ source/drain implants from reaching the semiconductor substrate. Cross-sectional views along both A-A' and B-B' of FIG. 9 are shown in FIG. 10. As seen in FIG. 10(b), there are no p+ regions in the substrate. The benefit of this cell is a more compact array with a potential cell size of $4F^2$.

Figure 11:
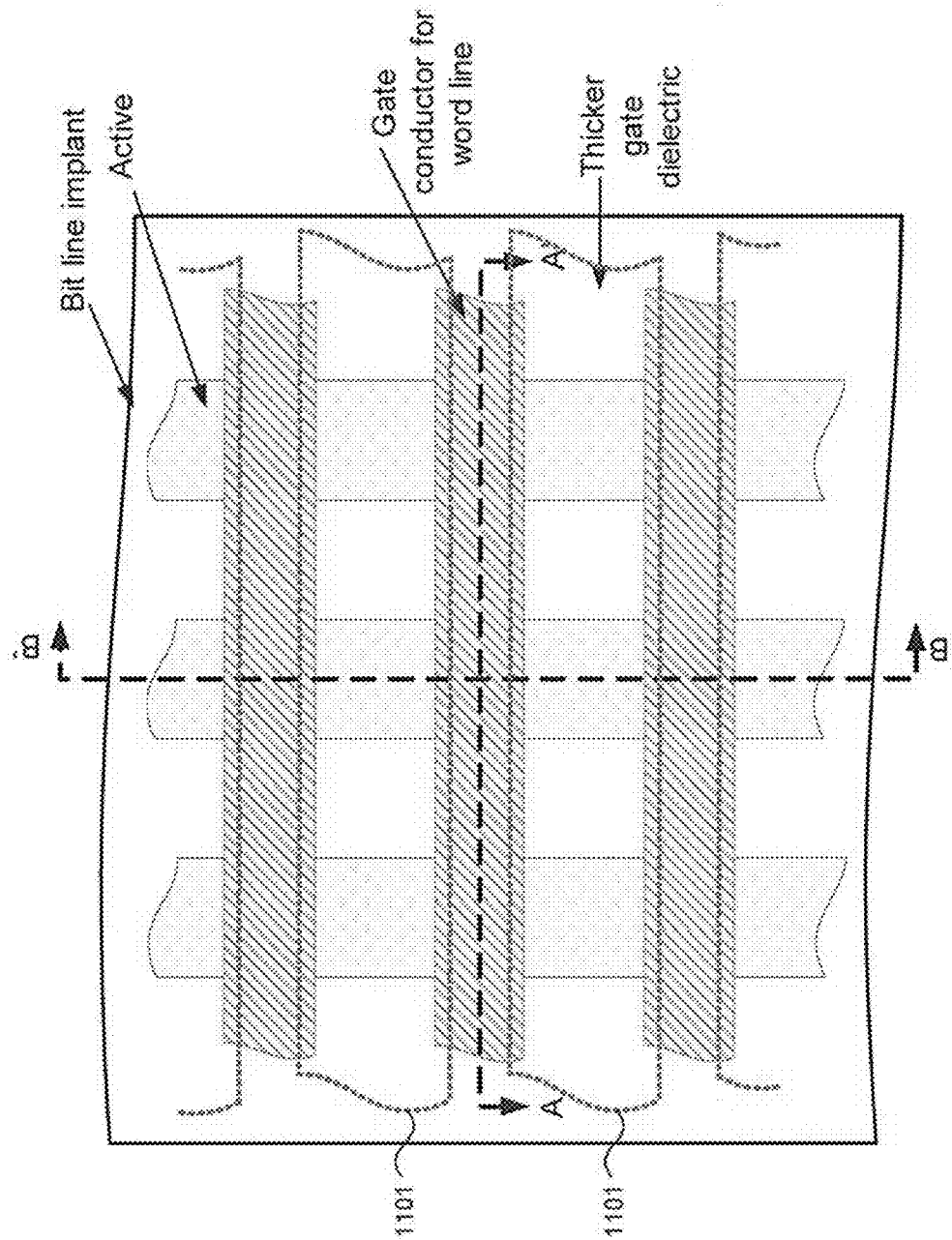
FIG. 11 shows a third embodiment of a memory array.
Figure 12:
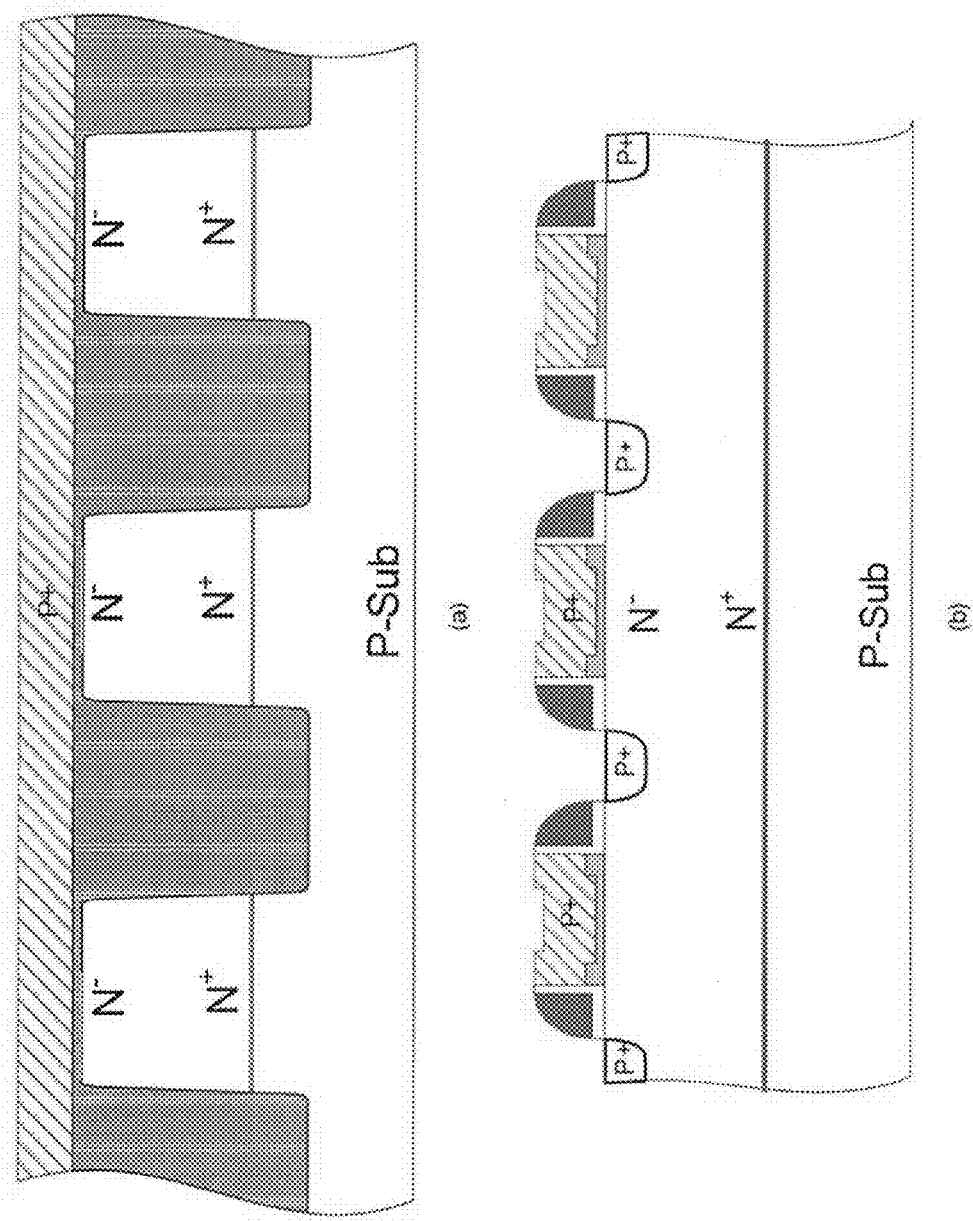
FIGS. 12a and 12b show cross-sectional views of the memory array of FIG. 11 taken along lines A-A' and B-B'.

Yet another embodiment is illustrated in FIGS. 11 and 12. The memory cell can be made from standard dual-oxide CMOS processes. In this embodiment, the gate oxide underneath the gate has a thicker region and a thinner region. The gate dielectric formed under a thicker gate dielectric mask is used to grow a thicker gate dielectric 1101, which can be the same as that of standard I/O oxide. The objective is to further restrict the breakdown locations away from the gate edges so that cell to cell sneak leakages can be significantly reduced. An example of the use of a thicker gate oxide is shown in commonly assigned U.S. Pat. No. 6,940,751, which is herein incorporated by reference. Cross-sectional views are shown in FIG. 12.

It can be appreciated that various combinations of the multiple concepts described herein may be combined into yet other embodiments. For example, the thicker gate oxide technique may be combined with the blocked source drain implant of FIGS. 9 and 10.

Figure 13:
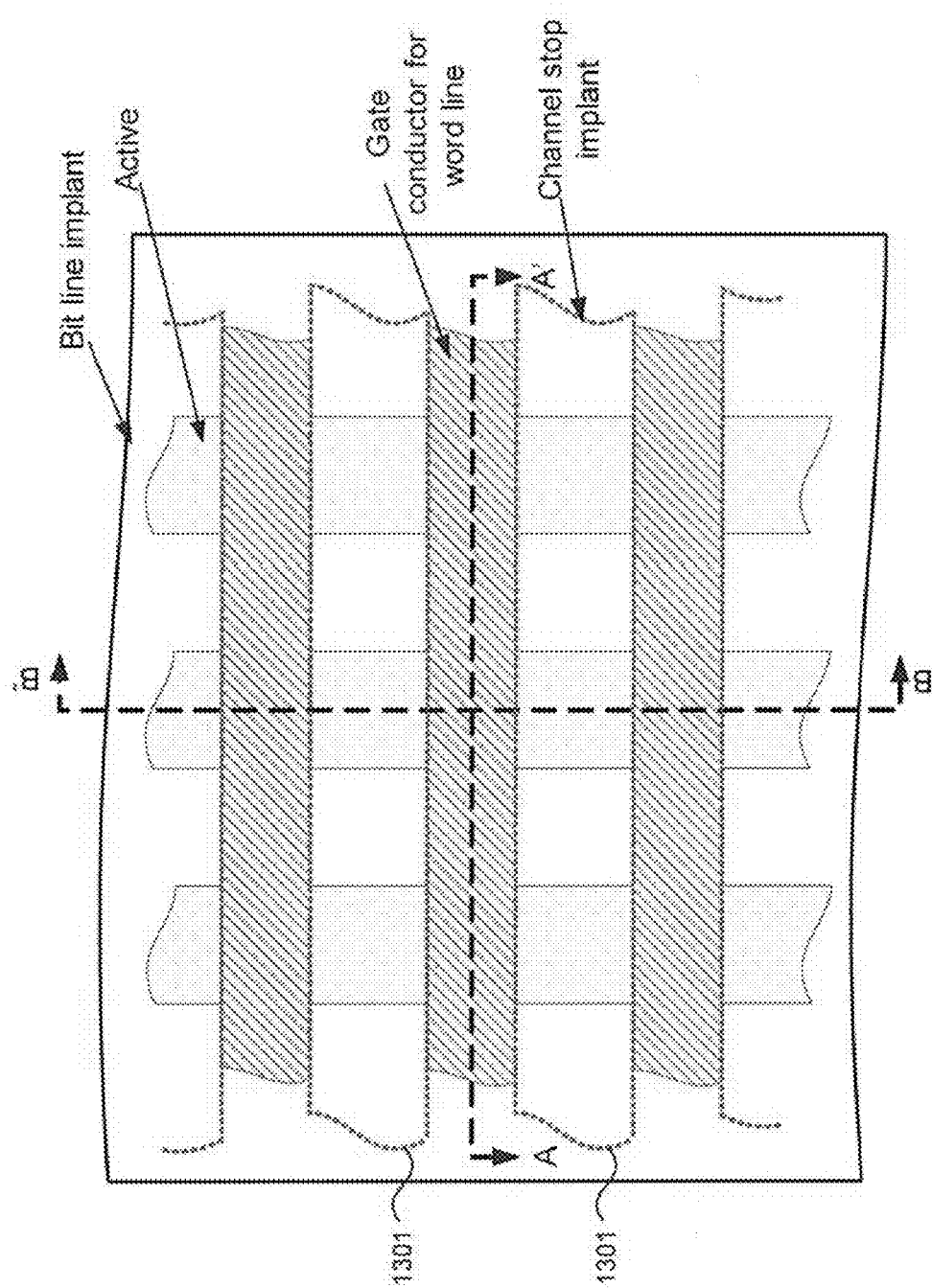
FIG. 13 shows a fourth embodiment of a memory array.
Figure 14:
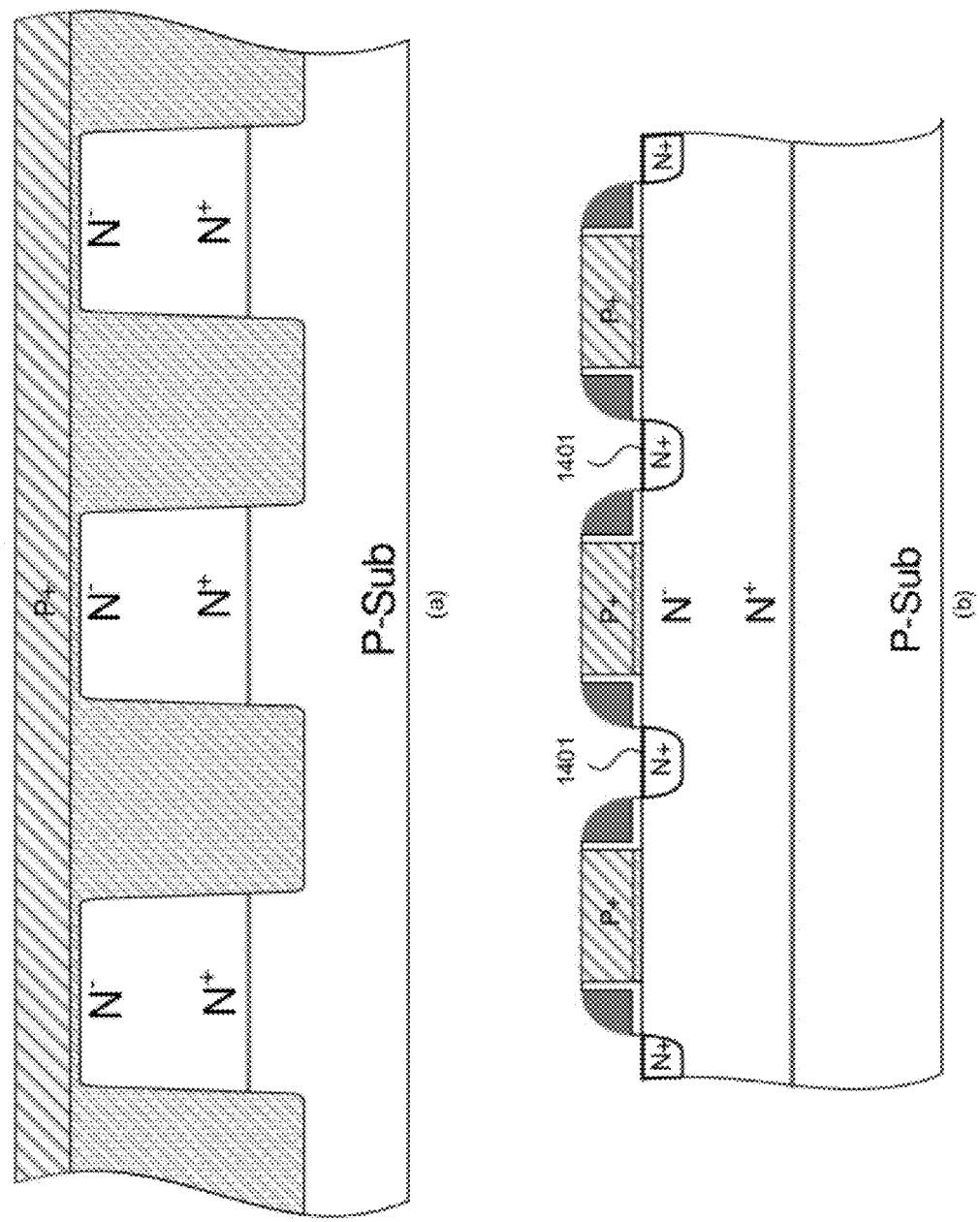
FIGS. 14a and 14b show cross-sectional views of the memory array of FIG. 13 taken along lines A-A' and B-B'.

Still, in yet another embodiment, the floating doped semiconductor regions can be n+-type. As shown in FIGS. 13 and 14, a channel stop implant layer 1301 is used to block the p+ source/drain implant and to open an n+ channel stop implant 1401. Cross-sectional views are given in FIG. 14. Although this structure provides even better cell to cell leakage current protection after they are programmed, it does require extra process steps and the addition of critical implant masks, with the associated alignment tolerance issues.

Figure 15:
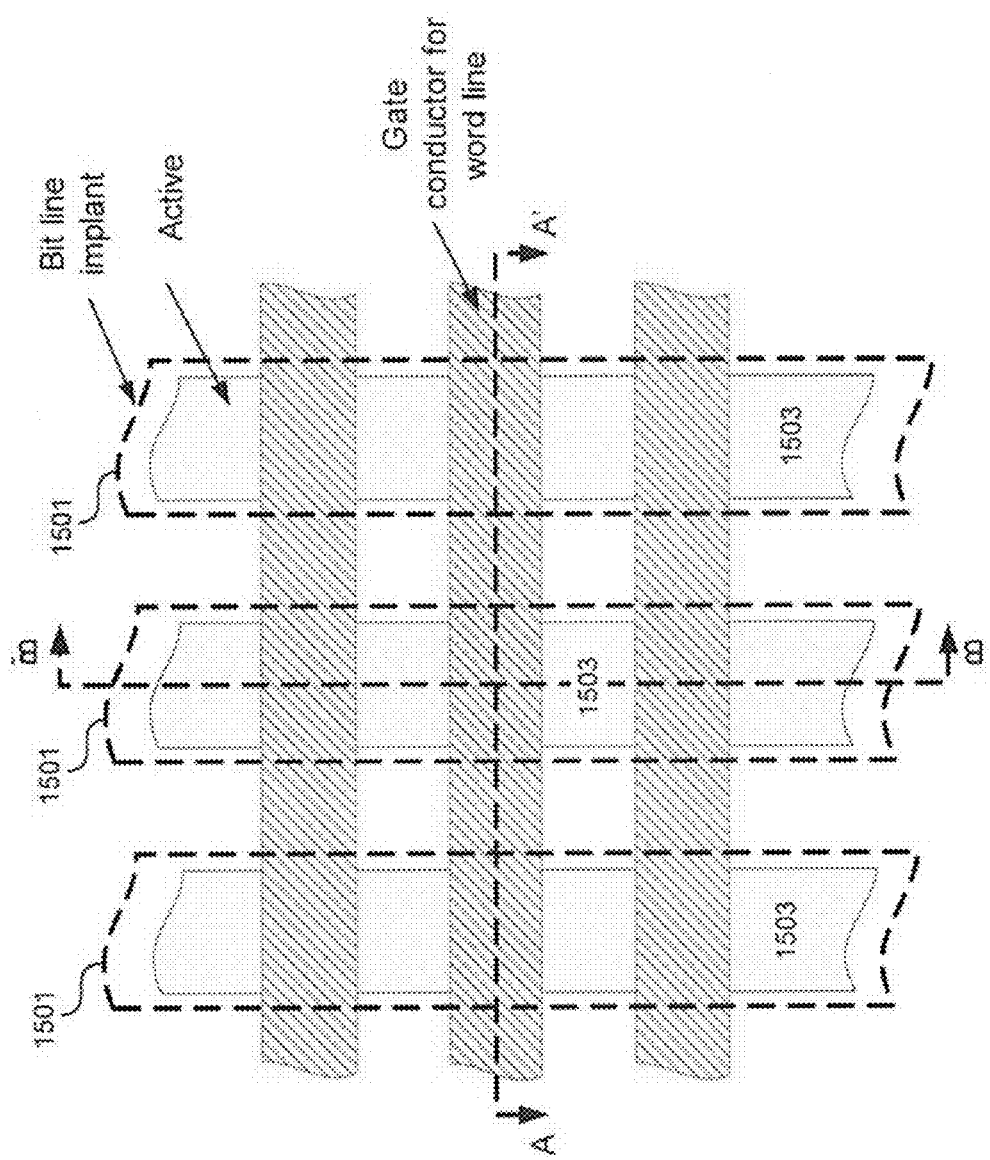
FIG. 15 shows a fifth embodiment of a memory array.

For OTP memories of smaller capacity, the memory array itself is a relatively small percentage of the total die area. In these embedded applications, it is advantageous to develop antifuse memories without introducing added mask and process steps in addition to standard CMOS processes. As such, yet another embodiment eliminates the additional CBI mask described above. FIG. 15 shows a layout view of this embodiment.

Figure 16:
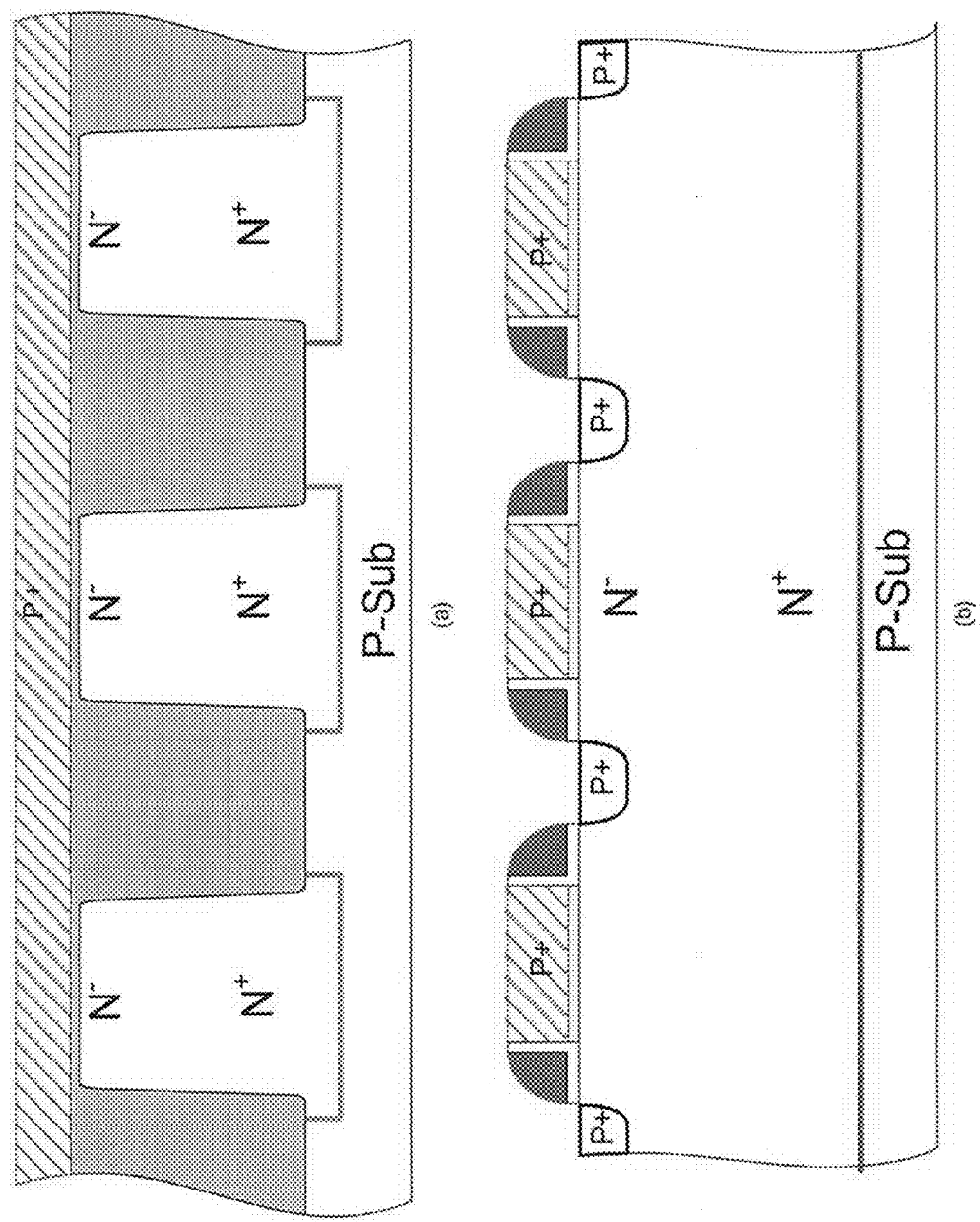
FIGS. 16a and 16b show cross-sectional views of the memory array of FIG. 15 taken along lines A-A' and B-B'.

In this embodiment, the bit line implant 1501 is the standard n-well implant mask. Instead of covering the whole memory array area, the n-well implant mask covers each active stripe 1503 individually. N-well spacing is designed to prevent BL to BL leakage during programming. The cell size of this embodiment is larger than the others because the regular n-well is deeper than that of STI. Cross-sectional views are given in FIG. 16.

Note that the above embodiments are for p-type MIS cells and can be easily switched to n-type MIS cells. Programming and read operations are the same for all p-type implementations. A simple polarity change applies to all n-type MIS cell embodiments.

Figure 17:
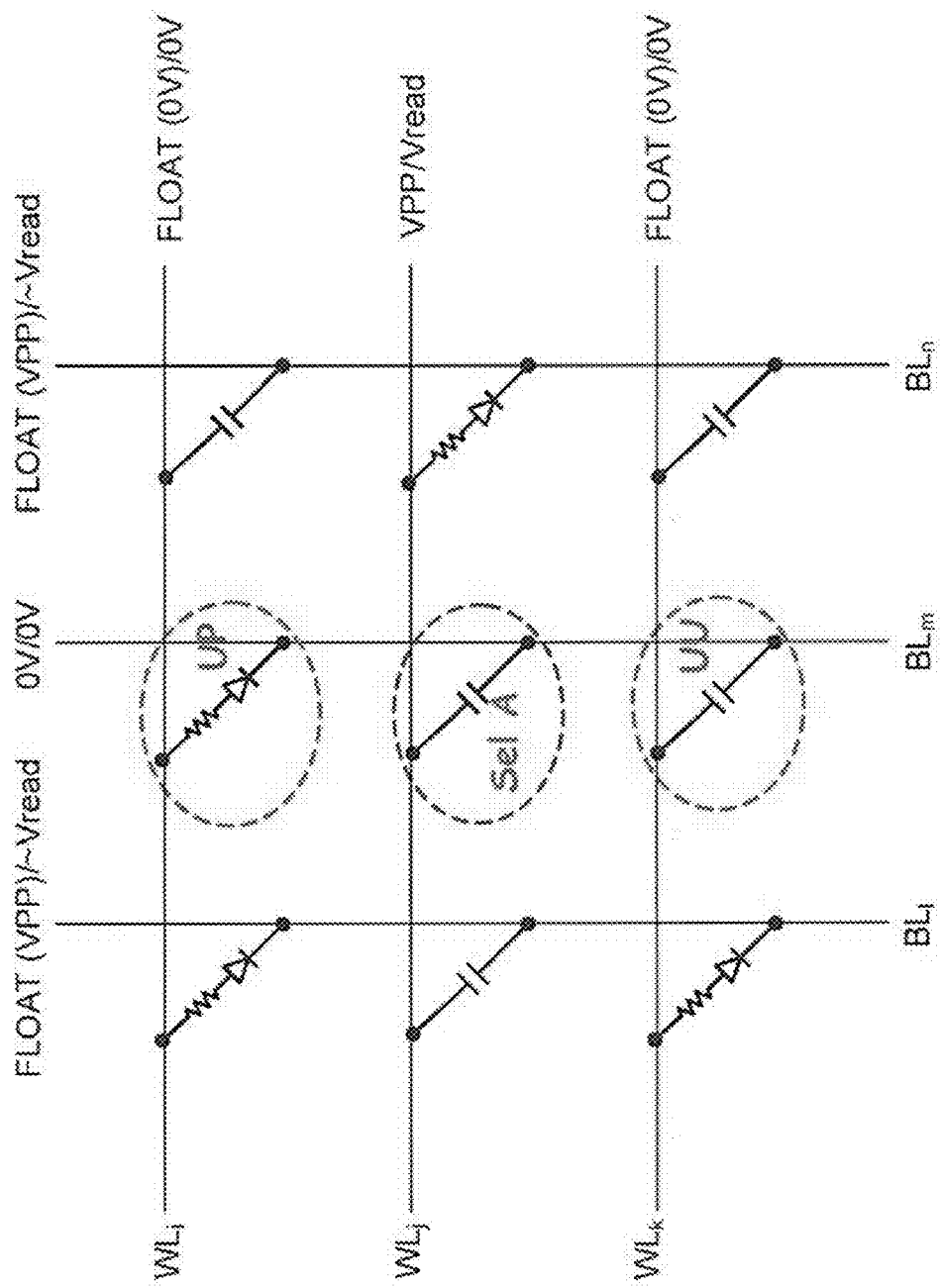
FIG. 17 shows a memory array during programming and reading.

With FIG. 17 as a reference for a p-type cell implementation, Table 1 below provides example bias conditions for both programming and read operations. The cell marked by 'Sel A' is assumed to be the selected cell for both program and read. Here the program Vpp and read Vread are for example only and their actual levels depend on the specific process technology used. For gate dielectrics with thickness of 6 nm to 32 nm, Vpp and Vread are preferred to be in the range of 3V~9V and 0.7V~3.3V, respectively. For the selected cell 'A', the capacitor is under accumulation and the full Vpp is applied across its gate dielectric. Its gate dielectric breaks down and the cell is programmed.

For an un-selected cell at (WLi, BLn), the MIS capacitor is under deep depletion and the cell will not be disturbed. For the un-selected cell at (WLi, BLl), the programmed cell behaves as a reverse biased diode and its leakage current is extremely small. There is no effective voltage developed across MIS cells at (WLj, BLl) and (WLj, BLn). During read operations, bias conditions are similar to those of programming except the change from Vpp to Vread.

TABLE 1

| Operation | WLi | WLj | WLk | BLl | BLm | BLn |
|---|---|---|---|---|---|---|
| Program | 0 V or Floating | Vpp | 0 V or Floating | Vpp or Floating | 0 V | Vpp or Floating |
| Read | 0 V or Floating | Vread | 0 V or Floating | Vread or Floating | 0 V | Vread or Floating |

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

We claim:

1. An antifuse-based one-time programmable non-volatile memory cell comprising:
   a buried bitline formed in a substrate, the buried bitline of a first conductivity type;
   a dielectric layer formed over at least a portion of the buried bitline;
   a conductive gate formed over the dielectric layer, the conductive gate defining a channel region under the conductive gate and dielectric layer; and
   sidewall spacers formed on sidewalls of the conductive gate;
   wherein the channel region does not have electrical interaction other than to said buried bitline or conductive gate; and
   wherein floating regions of a second conductivity type are formed in the substrate spaced away from the channel region by the sidewall spacers.

2. An antifuse-based one-time programmable non-volatile memory cell comprising:
   a buried bitline formed in a substrate, the buried bitline of a first conductivity type;
   a dielectric layer formed over at least a portion of the buried bitline;
   a conductive gate formed over the dielectric layer, the conductive gate defining a channel region under the conductive gate and dielectric layer; and
   sidewall spacers formed on sidewalls of the conductive gate;
   wherein the channel region does not have electrical interaction other than to said buried bitline or conductive gate; and
   wherein regions of higher dopant concentration of the first conductivity type are formed in the bitline spaced away from the channel region by the sidewall spacers.

3. An antifuse-based one-time programmable non-volatile memory cell comprising:
   a buried bitline formed in a substrate, the buried bitline of a first conductivity type;
   a dielectric layer formed over at least a portion of the buried bitline;
   a conductive gate formed over the dielectric layer, the conductive gate defining a channel region under the conductive gate and dielectric layer; and
   sidewall spacers formed on sidewalls of the conductive gate;
   wherein the channel region does not have electrical interaction other than to said buried bitline or conductive gate; and
   wherein the buried bitline has a graded dopant concentration with a lower dopant concentration near the dielectric layer and a higher dopant concentration deeper in the substrate.

4. The memory cell of claim 3, wherein said dielectric layer is thicker proximal to at least a portion of the edge of the channel region than to the center of the channel region.

5. The memory cell of claim 3, wherein the buried bitline is formed from standard n-well implants.

6. A memory array comprised of a plurality of antifuse-based one-time programmable non-volatile memory cells, the memory array comprising:
- a plurality of buried bitlines formed in a substrate, the buried bitline of a first conductivity type;
- a dielectric layer formed over at least a portion of the buried bitlines;
- a plurality of conductive gate wordlines formed over the dielectric layer, the conductive gate wordlines intersecting with the plurality of buried bitlines, the memory cells located at the intersection of said conductive gate wordlines and buried bitlines, further wherein a channel region is defined under the intersection of said conductive gate wordlines and buried bitlines and dielectric layer;
- sidewall spacers formed on the sidewalls of the conductive gate of the memory cells;
- wherein the channel region does not have electrical interaction other than to said buried bitline or conductive gate; and
- wherein floating regions of a second conductivity type are formed in the substrate spaced away from the channel region by the sidewall spacers.

7. A memory array comprised of a plurality of antifuse-based one-time programmable non-volatile memory cells, the memory array comprising:
- a plurality of buried bitlines formed in a substrate, the buried bitline of a first conductivity type;
- a dielectric layer formed over at least a portion of the buried bitlines;
- a plurality of conductive gate wordlines formed over the dielectric layer, the conductive gate wordlines intersecting with the plurality of buried bitlines, the memory cells located at the intersection of said conductive gate wordlines and buried bitlines, further wherein a channel region is defined under the intersection of said conductive gate wordlines and buried bitlines and dielectric layer;
- sidewall spacers formed on the sidewalls of the conductive gate of the memory cells;
- wherein the channel region does not have electrical interaction other than to said buried bitline or conductive gate; and
- wherein regions of higher dopant concentration of the first conductivity type are formed in the bitline spaced away from the channel region by the sidewall spacers.

8. A memory array comprised of a plurality of antifuse-based one-time programmable non-volatile memory cells, the memory array comprising:
- a plurality of buried bitlines formed in a substrate, the buried bitline of a first conductivity type;
- a dielectric layer formed over at least a portion of the buried bitlines; and
- a plurality of conductive gate wordlines formed over the dielectric layer, the conductive gate wordlines intersecting with the plurality of buried bitlines, the memory cells located at the intersection of said conductive gate wordlines and buried bitlines, further wherein a channel region is defined under the intersection of said conductive gate wordlines and buried bitlines and dielectric layer;
- wherein the channel region does not have electrical interaction other than to said buried bitline or conductive gate; and
- wherein buried bitlines have a graded dopant concentration with a lower dopant concentration near the dielectric layer and a higher dopant concentration deeper in the substrate.

9. The memory array of claim 8 wherein said dielectric layer is thicker proximal to at least a portion of the edge of the channel region than to the center of the channel region.

10. The memory array of claim 8, wherein the sidewall spacer of adjacent conductive gate wordlines completely span the space between the adjacent gate wordlines.

11. The memory cell of claim 8, wherein shallow trench isolations are formed between the buried bitlines.

12. The memory array of claim 8, wherein buried bitlines are formed from standard n-well implants.

* * * * *